United States Patent
McKee et al.

[11] Patent Number: 6,093,242
[45] Date of Patent: *Jul. 25, 2000

[54] ANISOTROPY-BASED CRYSTALLINE OXIDE-ON-SEMICONDUCTOR MATERIAL

[75] Inventors: Rodney Allen McKee, Kingston; Frederick Joseph Walker, Oak Ridge, both of Tenn.

[73] Assignee: UT-Battelle, LLC, Oak Ridge, Tenn.

[*] Notice: This patent is subject to a terminal disclaimer.

[21] Appl. No.: 09/126,527

[22] Filed: Jul. 30, 1998

Related U.S. Application Data

[63] Continuation-in-part of application No. 08/692,343, Aug. 5, 1996, Pat. No. 5,830,270, and a continuation-in-part of application No. 08/868,076, Jun. 3, 1997.

[51] Int. Cl.[7] .................................................. C30B 33/04
[52] U.S. Cl. ............................ 117/2; 117/3; 117/4; 117/5
[58] Field of Search ...................... 117/434, 5; 423/593

[56] References Cited

U.S. PATENT DOCUMENTS

| | | | |
|---|---|---|---|
| 5,058,250 | 10/1991 | Turnbull | 29/25.35 |
| 5,225,031 | 7/1993 | McKee et al. | |
| 5,295,218 | 3/1994 | Agostinelli et al. | 358/122 |
| 5,450,812 | 9/1995 | McKee et al. | |
| 5,576,879 | 11/1996 | Nashimoto | 359/248 |
| 5,654,229 | 8/1997 | Leplingard et al. | 117/56 |
| 5,666,305 | 9/1997 | Mihara et al. | 365/145 |
| 5,830,270 | 11/1998 | McKee et al. | 117/106 |

OTHER PUBLICATIONS

Wu et al., "Domain structure and polarization reversal in films of ferroelectric bismuth titanate", Ferroelectrics vol. 3, pp. 217–224, 1972.

*Primary Examiner*—Robert Kunemund
*Attorney, Agent, or Firm*—Michael E. McKee; George L. Craig; Joseph A. Marasco

[57] ABSTRACT

A semiconductor structure and device for use in a semiconductor application utilizes a substrate of semiconductor-based material, such as silicon, and a thin film of a crystalline oxide whose unit cells are capable of exhibiting anisotropic behavior overlying the substrate surface. Within the structure, the unit cells of the crystalline oxide are exposed to an in-plane stain which influences the geometric shape of the unit cells and thereby arranges a directional-dependent quality of the unit cells in a predisposed orientation relative to the substrate. This predisposition of the directional-dependent quality of the unit cells enables the device to take beneficial advantage of characteristics of the structure during operation. For example, in the instance in which the crystalline oxide of the structure is a perovskite, a spinel or an oxide of similarly-related cubic structure, the structure can, within an appropriate semiconductor device, exhibit ferroelectric, piezoelectric, pyroelectric, electro-optic, ferromagnetic, antiferromagnetic, magneto-optic or large dielectric properties that synergistically couple to the underlying semiconductor substrate.

19 Claims, 2 Drawing Sheets

ANISOTROPY-BASED CRYSTALLINE OXIDE-ON-SEMICONDUCTOR MATERIAL

This application is a continuation-in-part application of application Ser. No. 08/692,343, filed Aug. 5, 1996, now U.S. Pat. No. 5,830,270 the disclosure of which is incorporated herein by reference and of application Ser. No. 08/868,076, filed Jun. 3, 1997, the disclosure of which is incorporated herein by reference.

This invention was made with Government support under Contract No. DE-AC05-96OR22464 awarded by the U.S. Department of Energy to Lockheed Martin Energy Research Corporation, and the Government has certain rights in the invention.

BACKGROUND OF THE INVENTION

This invention relates generally to semiconductor device technology and relates, more particularly, to semiconductor devices including a semiconductor-based substrate onto which is grown a crystalline oxide material.

Anisotropic crystals are known to possess properties or qualities which differ according to the direction of measurement. Particular examples are found in the anisotropy of critical phenomena like Curie ordering in magnetic and ferroelectric oxide structures. In some crystalline oxides, for example, the Curie ordering induces internal magnetic or electric fields at the onset of dipole ordering which is naturally disposed in a prescribed orientation relative to the body of the crystal. Furthermore, it is also known that the application of an externally-applied magnetic or electric field can re-orient (e.g. reverse) these induced internal magnetic or electric fields.

Heretofore, oxides have been incorporated within electronic devices, such as transistors, but only in the amorphous state or in a polycrystalline microstructure. Furthermore, these oxides (in the amorphous state or polycrystalline microstructure) do not exhibit any collective anisotropic behavior.

We have described in our co-pending application Ser. No. 08/692,343 filed Aug. 5, 1996 how alkaline earth and perovskite oxides can be grown unstrained and commensurately upon silicon to form a structure series of $(AO)_n$ $(A'BO_3)_m$, in which n and m are non-negative integer repeats of single plane commensurate oxide layers and that this structure can be utilized in the development of a new semiconductor technology. We have also described in our co-pending application Ser. No. 08/868,076 filed Jun. 3, 1997 that strain coupling to the anisotropy of crystal energy associated with ferroelectric phase transformations can be used to control gate-sized dependence of active metal-oxide-semiconductor (MOS) capacitors.

It is an object of the present invention to provide a new and improved structure for use in a semiconductor device including a semiconductor-based substrate upon which is grown a thin film of crystalline oxide wherein the crystalline oxide is capable of exhibiting anisotropic properties which are beneficial for operation of the devices.

Another object of the present invention is to provide such a structure wherein directional-dependent qualities of substantially all of the unit cells of the crystalline oxide are predisposed along a limited number of axes.

Still another object of the present invention is to provide such a structure wherein a directional-dependent quality of substantially all of the unit cells of the crystalline oxide are oriented in a plane parallel to the surface of the substrate.

Yet another object of the present invention is to provide such a structure wherein a directional-dependent quality of substantially all of the unit cells of the crystalline oxide is oriented along lines normal to the surface of the substrate.

A further object of the present invention is to provide a new and improved semiconductor device within which a crystalline oxide-on-silicon structure is incorporated and whose operation involves the application of an internally-applied or externally-applied field across the crystalline oxide thin film.

SUMMARY OF THE INVENTION

This invention resides in a semiconductor structure and device including a thin film of crystalline oxide arranged upon a semiconductor-based substrate wherein the crystalline oxide includes unit cells which are capable of exhibiting anisotropic behavior. In addition, the crystalline oxide is arranged in a unit cell arrangement upon the semiconductor-based substrate so that in-plane stain is induced within the unit cells of the crystalline oxide so that a predisposed orientation is thereby imparted to a directional dependent quality of the oxide.

In an embodiment of the structure, a thin film of crystalline oxide is epitaxially arranged in layers upon the surface of a semiconductor-based substrate, and the unit cells of the crystalline oxide are geometrically-influenced by the induced in-plane strain so that a directional-dependent quality of substantially all of the unit cells of the crystalline oxide are arranged parallel to the surface of the substrate or are oriented along lines normal to the surface of the substrate.

DETAILED DESCRIPTION OF THE ILLUSTRATIVE EMBODIMENTS

In the paragraphs which follow, exemplary structures are described in which a crystalline oxide is utilized in a thin film layup which has been grown upon a semiconductor-based substrate so that the unit cells of the crystalline oxide thin film are epitaxially, and in some cases commensurately, arranged upon the substrate and wherein the unit cells of the crystalline thin film are exposed to an in-plane strain (which may be a positive strain or a negative strain) at the substrate/thin film interface. Furthermore, the in-plane strain to which the unit cells are exposed arranges a directional-dependent quality of the unit cells of the thin film along predisposed axes which render the resulting structure advantageous for a number of semiconductor device applications in which a magnetic, electric or optic field is applied to the device. Even in an instance in which a crystalline oxide whose unit cells are naturally isotropic is used as the thin film overlayer, anisotropic behavior can be induced in the oxide by way of the in-plane strain, and this behavior be used beneficially within a semiconductor structure. As used herein, a crystalline oxide is said to be capable of exhibiting anisotropic behavior if it possesses a directional-dependent quality, such as a dipole moment or dielectric constant.

Figure 1:
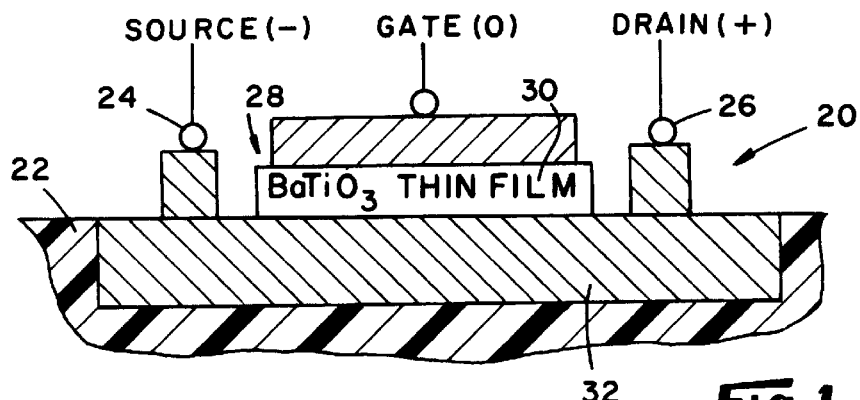
FIG. 1 is a schematic cross-sectional view of a fragment of a ferroelectric field effect transistor (FFET) utilizing a perovskite thin film as a layer of a gate dielectric.

Turning now to the drawings in greater detail, there is shown in FIG. 1 a schematic cross section of a fragment of a ferroelectric field effect transistor (FFET), indicated 20, embodying features of the present invention. To this end, the transistor 20 includes a base, or substrate 22 of silicon, a source electrode 24, a drain electrode 26, and a gate dielectric 28. Incorporated within the gate dielectric 28 is a thin film layer 30 of the perovskite $BaTiO_3$ which directly overlies the substrate 22 and is disposed beneath the remainder of the gate dielectric 28 so as to be positioned adjacent the epilayer 32 of the transistor 20. The transistor 20 includes a crystalline oxide-on-silicon (COS) structure, but it will be understood that in accordance with the principles of the present invention, a structure can involve a film of crystalline oxide grown upon an alternative semiconductor-based substrate constructed, for example, of silicon-germanium pure germanium or other materials in the Group III-V, IV and II-IV classes. Along these lines, the substrate can be comprised of silicon-germanium ($Si_yGe_{1-y}$) wherein the variable "y" could range from 0.0 to 1.0.

Since ferroelectric materials possess a permanent spontaneous electric polarization (electric dipole moment per unit centimeter) that can be reversed by an electric field, the disposition of the $BaTiO_3$ thin film layer 30 in the transistor 20 in the manner described permits the ferroelectric dipoles to be switched, or flipped, in a manner which aids in the modulation of the charge density and channel current of the transistor 20. For example, the transistor 20 can be turned ON or OFF by the action of the ferroelectric polarization, and if used as a memory device, the transistor 20 can be used to read the stored information (+or –, or "1" or "0") without ever switching or resetting (hence no fatigue).

It is known that unit cells of the perovskite oxide $BaTiO_3$, when in a crystalline form, are anisotropic in that its unit cells possess directional-dependent qualities, such as a dipole moment. However, previous semiconductor devices have not relied upon anisotropic response of the gate oxide. Within the transistor 20, however, the thin film 30 of $BaTiO_3$ consists of $BaTiO_3$ in a crystalline form and the unit cells of $BaTiO_3$ are arranged upon the silicon substrate 22 so that the dipole moments of the unit cells are arranged in a limited number of directions. In particular, the dipole moments of substantially all of the unit cells of $BaTiO_3$ in the thin film 30 are disposed along lines oriented normal to the surface of the substrate 22, and as such, the charge density and channel currents are controlled by the internal fields set up by the predisposition of the dipole moments oriented normal to the substrate material.

As will be apparent herein, the thin film of $BaTiO_3$ is grown upon the underlying silicon substrate 22 in a manner so that a negative strain (i.e. compression) is induced within the plane of the thin film (i.e. in a plane parallel to the substrate surface) so that the consequential misshapening of the unit cells by this negative strain condition predisposes the directional dependent quality, i.e. the dipole moment, of each unit cell along lines normal to the surface of the silicon substrate 22.

For purposes of constructing the transistor 20 (and, in particular, the build-up of $BaTiO_3$ atop silicon so that the unit cells of $BaTiO_3$ are epitaxially arranged upon the silicon substrate), reference can be had to the description of our crystalline-on-silicon (COS) deposition process set forth in our co-pending application Ser. No. 08/868,076. Briefly, by way of example, steps can be taken to cover the surface of the silicon substrate 22 with a thin alkaline earth oxide film of $Ba_{0.725}Sr_{0.275}O$, then to cover the earth oxide film with a thin perovskite (template) film of $SrTiO_3$, and then to cover the template film with the desired (multi-stratum) film of $BaTiO_3$. Each of the alkaline earth oxide film and the template film and at least the first few initial layers of the $BaTiO_3$ film is constructed in somewhat of a single plane-layer-by-single plane layup fashion to ensure commensurate periodicity throughout the build up of the COS structure and wherein the films are selected for use in the build-up of the structure for the lattice parameters of the unit cells of the films. For example, the template film of $SrTiO_3$ will induce a –2% strain in the $BaTiO_3$ unit cells at the interface with the $BaTiO_3$ film, while the omission of the template film of $SrTiO_3$ (between the $Ba_{0.725}Sr_{0.275}O$ and the $BaTiO_3$) will induce a strain of –4% in $BaTiO_3$ unit cells. Accordingly, in an alternative embodiment of a COS structure in which greater strain is desired to be induced within the $BaTiO_3$ unit cells, the $SrTiO_3$ template can be omitted.

The negative strain which is induced within the $BaTiO_3$ thin film is due in part to the differences in the lattice parameters between the unit cells of silicon and those of the thin film materials used in the construction process and the commensurate periodicity of the unit cells in the thin film layup. More specifically, the lattice parameter of each of silicon and $Ba_{0.725}Sr_{0.275}O$ is 0.543 nm while the lattice parameter of $SrTiO_3$ is about 0.392 nm (which is slightly greater than the 0.543 figure divided by the square root of 2.0). Consequently, there will exist no measurable strain at the interface of the unit cells of silicon and $Ba_{0.725}Sr_{0.275}O$, while the unit cells of the $SrTiO_3$ film have an orientation which is rotated 45° with respect to the underlying unit cells of $Ba_{0.725}Sr_{0.275}O$ and are in a state of negative strain (i.e. compression) due to the difference between the lattice parameter (0.392 nm) of $SrTiO_3$ when in an unstrained condition and the lattice parameter (0.543 nm) of silicon divided by the square root of 2.0 (or 0.384). Furthermore, the lattice parameter of $BaTiO_3$ is about 0.4 nm so that unit cells of $BaTiO_3$ are also in a state of negative strain (i.e. compression) as they overlie the $SrTiO_3$ film.

The commensurate periodicity of the layup of thin film layers constrains (and clamps) the lattice structures together at the interface of each successive silicon/thin film or thin film/thin film interface so that during the cooldown of the resultant COS structure from a relatively high deposition temperature, the lattice structures of the unit cells of the thin films must conform in size to the lattice structure of the dominant material, which in this case is silicon. Consequently, at the end of a cooldown period to a temperature (e.g. about room temperature) which is appreciably lower than the deposition temperature at which the various thin-film layers were deposited upon the silicon, each unit cell of $BaTiO_3$ at the $SrTiO_3/BaTiO_3$ interface (which is, in essence, the $Si/BaTiO_3$ interface) assumes an in-plane compressed condition as its lattice parameter (as measured in-plane of the film) seeks to match the 0.384 nm figure discussed above.

In other words, upon achieving a lower temperature, e.g. room temperature, following cooldown of a COS structure from its growth temperature, the unit cells of the $BaTiO_3$ film adjacent the $Si/BaTiO_3$ interface are constrained to a smaller in-plane area than would be the case if it were not so constrained. Consequently, the in-plane contraction of the unit cells of $BaTiO_3$ effects a lengthening of the out-of-plane lattice parameter of the unit cells of the $BaTiO_3$ film as a path is traced therethrough from the surface of the silicon (as the unit cell seeks to maintain a constant volume) so that each unit cell assumes a tetragonal form (i.e. a somewhat distorted cubic shape) with its tetragonal axis (i.e. its longer axis) disposed normal to the surface of the silicon. This misshapening of the geometric shape of the unit cells of $BaTiO_3$ by the constraint at the $Si/BaTiO_3$ interface prevents the dipole moment of each unit cell from being naturally established along directions which are parallel to the surface of the substrate (i.e. normal to the longitudinal axis of the misshapened unit cell of $BaTiO_3$). Consequently, the geometric influence to which the $BaTiO_3$ unit cells are exposed predisposes the dipole moments of the unit cells of $BaTiO_3$ along axes, or lines, oriented generally normal to the surface of the substrate 22. For a more detailed description of the COS deposition process involving a layup of $BaTiO_3$ upon silicon, reference can be had to the referenced application Ser. No. 08/868,076, as well as application Ser. No. 08/692,343, the disclosures of which are incorporated herein by reference.

As mentioned earlier, the ferromagnetic nature of the BaTiO3 thin film 30 in the FIG. 1 FFET 20 enables the polarization of the unit cells of the film 30 to be switched by the application of an electric field between the gate dielectric 24 and the substrate 22 and thereby control the modulation of the charge density and channel current of the transistor 20. By utilizing the $BaTiO_3$ thin film 30 in the transistor 20 so that the dipole moments of the unit cells of the film 30 are arranged in planes oriented normal to the substrate surface, in-plane mechanical restraint through the $BaTiO_3$ thin film 30 is so robust that a relatively large threshold voltage must be applied across the gate dielectric 24 and the substrate 22 to effect the switching of the dipole moments of the thin film 30 to an in-plane orientation. Such a feature is advantageous in that the dielectric response needs to be insensitive to an applied field over some (i.e. a minimum) range in order to allow design or optimization of its use in a capacitor for charge storage such as might be found in a DRAM application.

Although the aforedescribed FFET 20 of FIG. 1 has been described as including a thin-film comprised of unit cells of an anisotropic perovskite whose directional-dependent qualities, e.g. its dipole moments, are oriented along lines arranged normal to the silicon substrate, a field-effect transistor (FET) can be constructed with a thin-film of anisotropic perovskite whose directional-dependent qualities, e.g. it dipole moments, are arranged in-plane of the thin film and are switched out-of-plane upon the application of an electric field between the gate dielectric and the substrate. Briefly, the perovskite $BaTiO_3$ is grown commensurately upon a silicon substrate in such a manner so that the unit cells of the $BaTiO_3$ are exposed to a positive (i.e. tensile-strained) in-plane strain which misshapens the $BaTiO_3$ unit cells to a tetragonal shape so that the dipole moments thereof are prevented from naturally orienting themselves out-of-plane (i.e. normal to the plane of the silicon substrate). In order to permit the dipole moments to be poled out-of-plane with the application of an externally-applied field, the edges of selected regions of the $BaTiO_3$ thin film are either cut away or otherwise treated to relieve some of the in-plane strain to which the unit cells of $BaTiO_3$ is exposed. For a more complete description of a transistor within which a thin film of $BaTiO_3$ is employed and wherein the dipoles of the unit cells of $BaTiO_3$ are predisposed by the constraints (those induced commensurately and thermally) of the underlying silicon lattice to orientations within the plane of the film, reference can be had to the referenced co-pending application Ser. No. 08/868,076, the disclosure of which is incorporated herein by reference.

Furthermore, although the aforedescribed FFET 20 of FIG. 1 has been described as including a thin-film of $BaTiO_3$ material whose unit cells naturally exhibit anisotropic behavior, a structure in accordance with the present invention may include a thin film crystalline oxide layer whose unit cells, while not naturally anisotropic, can be made to exhibit anisotropic behavior by the in-strain (e.g. either positive or negative strain) induced within the unit cells of the thin film layer grown upon a semiconductor-based substrate. For example, the crystalline form of $SrTiO_3$ has unit cells which are naturally isotropic, and a useful property of the unit cells (i.e. its dielectric constant) may naturally exhibit a directional dependence. However, by inducing a desired strain within the unit cells of the $SrTiO_3$ thin film material so that the unit cells of $SrTiO_3$ are distorted to a tetragonal shape whose smallest side area is closest to the semiconductor substrate, the dielectric constant will exhibit uniaxial behavior associated with the tetragonal distortion.

For example, by constructing a COS structure wherein the perovskite $SrTiO_3$ is intended to be the active layer which couples to the underlying silicon, $SrTiO_3$ can be deposited upon silicon so that a cooling of the resultant structure from the high deposition temperature to a lower temperature (e.g. about room temperature), the negative in-plane (compressive) strain induced at the $Si/SrTiO_3$ interface distorts the geometric (normally cubic) shape of the unit cells of the $SrTiO_3$ to a tetragonal shape so that the dielectric constant of each unit cell is biased by the strain and thereby alters the dielectric constant of the COS structure. It follows that by controlling the amount of in-plane strain at the $Si/SrTiO_3$ interface, the electric (or dielectric) response of the resulting structure can be controlled.

Figure 2:
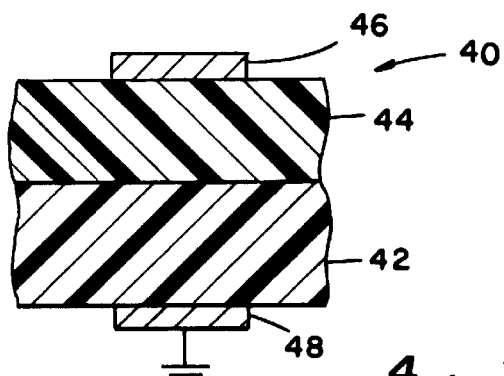
FIG. 2 is a schematic cross-sectional view of a fragment of a capacitor utilizing a perovskite thin film as a dielectric layer.

With reference to FIG. 2, there is schematically shown a capacitor 40 for dynamic random access memory (DRAM) circuit including a silicon layer 42 and an oxide (dielectric) layer 44 comprised of a thin film of $BaTiO_3$ which are in superposed relationship and which are sandwiched between a gate 46 and a ground terminal 48. In use, an information-providing signal is collected from the capacitor 40 by measuring the current of the capacitor 40 during a discharge cycle. Therefore, the greater the dielectric constant exhibited by the oxide layer 44, the greater the charge-storage capacity of the capacitor 40.

It is a feature of the capacitor 40 that the dipole moments of substantially all of the unit cells of the $BaTiO_3$ are oriented along a plane which is generally parallel to the surface of the silicon layer 42 upon which it overlies. While it was positive in-plane strain which was responsible for orienting the dipole moments of the $BaTiO_3$ normal to the substrate surface in the FFET 20 of FIG. 1, it is negative (e.g. tensile-strained) in-plane strain induced at the $Si/BiO_3$ interface which is responsible for orienting the dipole moments of the $BaTiO_3$ unit cells parallel to the substrate surface in the capacitor 40 of FIG. 2. In other words, due to the in-plane strain induced in the $BaTiO_3$ crystals at the $Si/BaTiO_3$ interface, the dipole moments of the $BaTiO_3$ crystals of the dielectric layer 44 are oriented along a plane which is generally parallel to the surface of the silicon layer 42 upon which it overlies.

Such a feature is advantageous in that the dielectric constant for the non-polar axis of the tetrahedral unit cell is ten to one-hundred times larger than the dielectric constant along the polar axis. Therefore, since the stored charge in a capacitor is directly proportional to the dielectric constant, more charge can be stored in the capacitor if its polar axis is normal to the applied electric field.

Again, for a description of the construction of a structure, such as the capacitor 40, comprised of a thin film of $BaTiO_3$ overlying a silicon substrate wherein the dipoles of the unit cells of $BaTiO_3$ are predisposed by the constraints of the underlying silicon lattice to orientations within the plane of the film, reference can be had to the referenced co-pending application Ser. No. 08/868,076.

Figure 3:
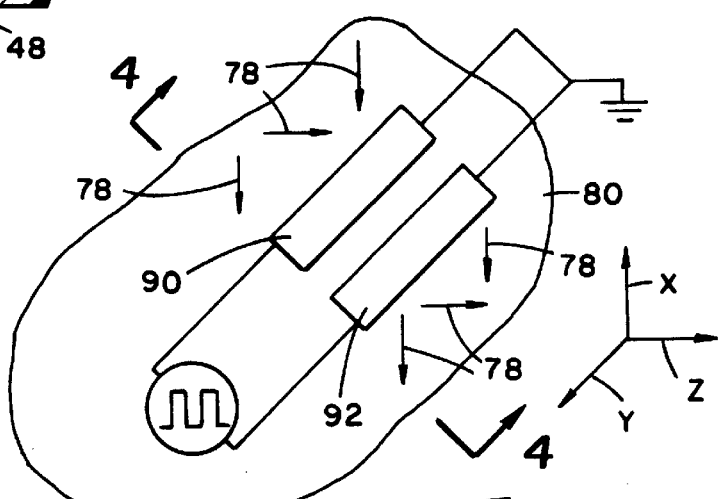
FIG. 3 is a plan view of an electro-optic device within which features of the present invention are embodied.
Figure 4:
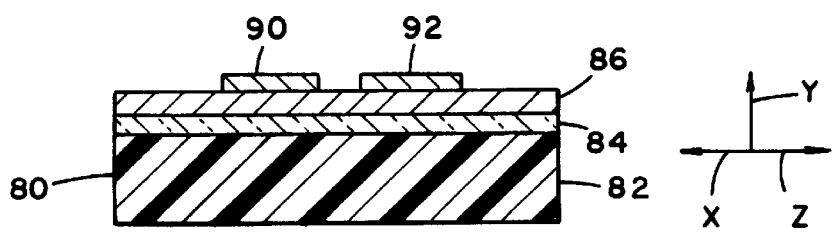
FIG. 4 is a cross-sectional view taken about along line 4—4 of FIG. 3.

With reference to FIGS. 3 and 4, there is illustrated an electro-optic structure 80 having a substrate 82 of silicon, an intermediate thin film 84 of MgO and a thin film layer 86 of the perovskite $BaTiO_3$ overlying the MgO layer 84. The unit cells of the $BaTiO_3$ layer 86 are geometrically influenced by the lattice structure of the underlying silicon substrate 82 so that the dipoles of the unit cells of $BaTiO_3$ are oriented within the plane of the $BaTiO_3$ film 86 (i.e. parallel to the surface of the silicon substrate 82). In the structure 80, the orientation (and exemplary dimensions) of the polar axes of the unit cells in the plane of the $BaTiO_3$ film 86 are indicated with the arrows 78, and the light which is directed through the film 86 is directed therethrough along the indicated "z" direction and is polarized in-plane. As will be apparent herein, the electric field which is applied between electrodes 90 and 92 is arranged at about an ninety degree angle within respect to the direction of light directed through the $BaTiO_3$ film and forty-five degrees relative to the orientation of the polar axes of the $BaTiO_3$ unit cells.

To construct the electro-optic device 80, reference can be had to the combined teachings of U.S. Pat. No. 5,225,031 and co-pending application Ser. No. 08/681,880, filed Jul. 29, 1996 (each of which identifies as inventors the named inventors of the instant application), the disclosures of which are incorporated herein by reference, so that a detailed description is not believed to be necessary. Briefly, however, and in accordance with the teachings of the referenced U.S. Pat. No. 5,225,031, the MgO film 84 is grown in a layer-by-layer fashion upon the underlying silicon substrate 82 following an initial growth procedure involving the growth of a fraction (e.g. one-fourth) of a monolayer of an alkaline earth metal (e.g. Ba, Sr, Ca or Mg) upon the silicon at appropriate growth conditions to form $ASi_2$ wherein "A" in this compound is the alkaline earth metal. Upon achieving a MgO film 84 whose thickness is about 0.2–0.3 μm (1000 to 3000 monolayers), steps can be taken in accordance with the teachings of the referenced application Ser. No. 08/681,880 to construct the $BaTiO_3$ film 86 upon the MgO film 84. For example, the build-up of $BaTiO_3$ is initiated by growing a first single plane layer comprised of $TiO_2$ over the surface of the MgO film 84 and then growing a second single plane layer comprised of BaO over the previously-grown $TiO_2$ layer. The growth of the BaO plane is followed by the sequential steps of growing a single-plane layer of $TiO_2$ directly upon the previously-grown plane of BaO and then growing a single plane layer of BaO upon the previously-grown layer of $TiO_2$ until a desired thickness (e.g. 0.2–0.6 μm) of the $BaTiO_3$ film 86 is obtained.

Within the electro-optic structure 80, the $BaTiO_3$ film 86 is intended to serve as a waveguide for light transmitted through the structure 80, while the MgO film 84 serves to optically isolate the $BaTiO_3$ film 86 from the silicon substrate, as well as provide a stable structure upon which the $BaTiO_3$ is grown.

As mentioned above, the dipoles of the unit cells of the $BaTiO_3$ thin film 86 are oriented within the plane of the thin film 86, and the dipoles of the $BaTiO_3$ unit cells are arranged in this manner because of the in-plane thermoelastic strain induced within the unit cells of the $BaTiO_3$ film by the silicon. Briefly, the phase transformations and the thermal contractions (i.e. the linear thermal expansion or contraction) of the materials comprising the layers of the structure 80 during cooldown of the structure from the relatively high temperature at which film deposition occurs induces a positive (e.g. tensile) strain across the lattice structure of the $BaTiO_3$ unit cells within the plane of the film in a manner which affects the ferroelectric characteristics of the $BaTiO_3$ in a desired manner. To this end, the coefficient of thermal expansion of silicon is smaller than that of $BaTiO_3$ so that a uniform cooling of a structure comprised of a $BaTiO_3$ film-on-silicon results in the development of an appreciable in-plane strain within the unit cells of the $BaTiO_3$ film and the consequential transformation of the $BaTiO_3$ unit cells of the film to a tetragonal form.

More specifically, when the $BaTiO_3$ film transforms to the ferroelectric phase at the temperature of about 120° C., the form of a unit cell of $BaTiO_3$ is transformed to a tetragonal, or elongated, form wherein the lattice parameter as measured along one edge of the unit cell is larger than the lattice parameter as measured along a second edge of the unit cell wherein the second edge is arranged at a right angle with respect to the first edge. As the $BaTiO_3$-on-silicon structure is cooled from the deposition temperature, each $BaTiO_3$ unit cell naturally oriented so that the longest edge the cell is arranged parallel to the plane of the silicon substrate (in a natural attempt to minimize the in-plane strain to which the unit cell is exposed). This orientation of the unit cells also predisposes the polar axes (and hence the dipole moments) of the $BaTiO_3$ unit cells in a plane which is substantially parallel to the surface of the substrate.

It is known that the electro-optic response of a single crystal waveguide is effected by such factors as the orientation of the electric field, the orientation of polarization of light directed through the material, and the orientation of the crystal (with respect to the beam directed therethrough). Of the aforementioned factors, the last-mentioned factor (i.e. the orientation of the crystal) relates to the orientation of the dipoles of the crystal. Along the same lines, the electro-optic (EO) response (corresponding to the aforediscussed electro-optic coefficient) for a crystalline material, such as $BaTiO_3$, is described by a third rank tensor. The largest EO response in the thin film 86 of the structure 80 is achieved when the polarization is along the indicated x-z direction and a component of the electric field is in the x direction. Accordingly, an electric field is applied between the electrodes 90 and 92 positioned across the film 86, and the applied electric field is arranged at about a ninety degree angle with respect to the direction of light directed through the $BaTiO_3$ film and at about a forty-five degree angle with respect to the orientations of the polar axes of the $BaTiO_3$ unit cells to allow the mode of propagation in the device. Accordingly, the structure 80 can be used as a phase modulator wherein the $BaTiO_3$ thin film 86 serves as the waveguide through which a beam of light is transmitted and across which an electric field is applied (and appropriately controlled) for the purpose of altering the phase of the light beam transmitted through the $BaTiO_3$ film.

It follows from the foregoing that embodiments of structure have been described which include a thin film of crystalline oxide which has been grown upon an underlying semiconductor-based substrate and wherein an in-plane strain is induced within the thin film which influences, and alters, the geometric shape of the unit cells of the film. This altering of the geometric shape arranges a directional-dependent quality of the unit cells in a predisposed orientation with respect to the underlying substrate. When these structures are embodied in semiconductor devices which are exposed to an internally-applied or externally-applied field during operation, the predisposed orientation of the directional-dependent quality of the unit cells can beneficially contribute to the operation of the device.

For example, the overlying oxide material couples to the underlying semiconductor material for affecting the electronic capabilities of the substrate. In other words, with the geometry of the unit cells of the anisotropic material constrained so that the directional-dependent qualities of the unit cells are oriented either in a plane which is parallel to the substrate surface or along lines normal to the substrate surface, the coupling of the anisotropic material to the semiconductor substrate enables the substrate to behave in an advantageous and reproducible manner during an electronic application. As discussed above, such advantageous behavior can involve the modulation of charge density and channel current in a transistor. Thus, the structure of this invention can be advantageously embodied in semiconductor devices which use the coupling of the anisotropic thin film material with the underlying semiconductor application during an electronic application.

Although in-plane strain has been induced within the aforedescribed structures principally by either commensurate strain (e.g. wherein the lattice structure of the unit cells at the substrate/thin film interface are clamped to the underlying lattice structure of the substrate so that the unit cells of the thin film are in a strained or compressed condition as they are forced to conform in size to the lattice parameter of an underlying material) or thermally (wherein the differences in expansion coefficients between the thin film layer and the underlying substrate and the effects of phase transformations during cooling are principally responsible for the induced strain), it will be understood that in-plane strain can be induced by other means, such as mechanical means (e.g. by a physical bending of the structure) so that a desired in-plane strain is induced at the substrate/thin film interface.

It will be understood that numerous modifications and substitutions can be had to the aforedescribed embodiment without departing from the spirit of the invention. For example, although the aforediscussed embodiments have described as utilizing the perovskites $BaTiO_3$ or $SrTiO_3$ as the active thin film layer in a COS device, any crystalline oxide which is capable of exhibiting anisotropic behavior can be employed. For example, other perovskite oxides or spinels or oxides of similarly-related cubic structures can be used as the crystalline oxide thin film wherein the oxide is adapted to exhibit ferroelectric, piezoelectric, pyroelectric, electro-optic, ferromagnetic, anti-ferromagnetic, magneto-optic or large dielectric properties within the structure. (perovskites and spinels are similarly-related in the sense that the unit cells of each oxide possesses a cubic structure.) Further still, although the aforedescribed semiconductor devices have been described as a transistor, a capacitor or an electro-optic device, the principles of the present invention can be embodied in other semiconductor devices wherein the thin film overlayer synergistically couples to the underlying substrate, such as silicon.

Figure 5:
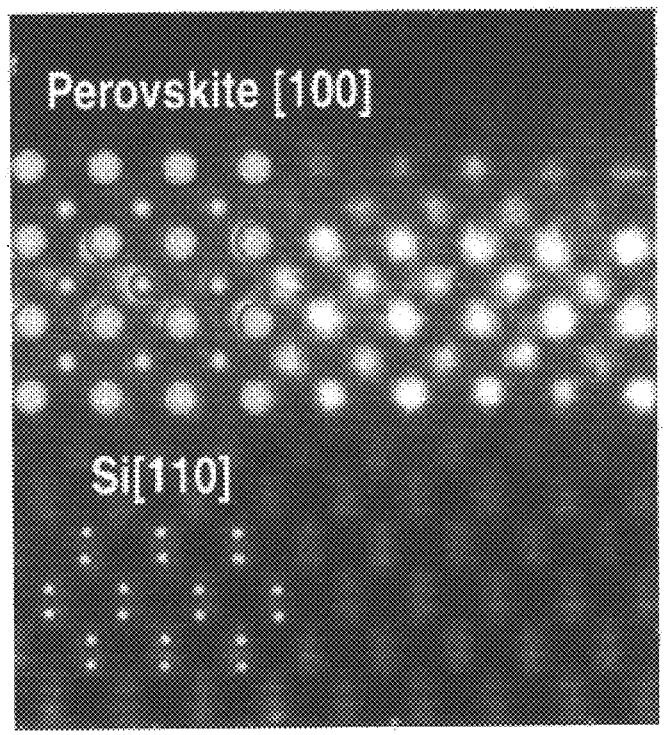
FIG. 5 is a Z-contrast image of $SrTiO_3$ on (100) silicon.

In accordance with the foregoing, we have experimentally established that perovskite oxides can be grown in perfect registry with the (100) face of silicon while totally avoiding the amorphous silica phase that forms when silicon is exposed to an oxygen-containing environment. In particular, a MOS capacitor has been constructed using the perovskite $SrTiO_3$ (as an alternative to amorphous $SiO_2$) and wherein its $SrTiO_3$ layer is 150 angstroms in thickness and the underlying silicon is p-type silicon. A Z-contrast image (taken at atomic scale) of a cross section of the constructed capacitor is shown in FIG. 5 illustrating the arrangement of atoms at the oxide/silicon interface. The epitaxy that is apparent from the FIG. 5 image is (100) $SrTiO_3$//(001) Si and $SrTiO_3$[110]//Si[100]. On the left side of the image is a projection of the perovskite/silicon projection.

Figure 6:
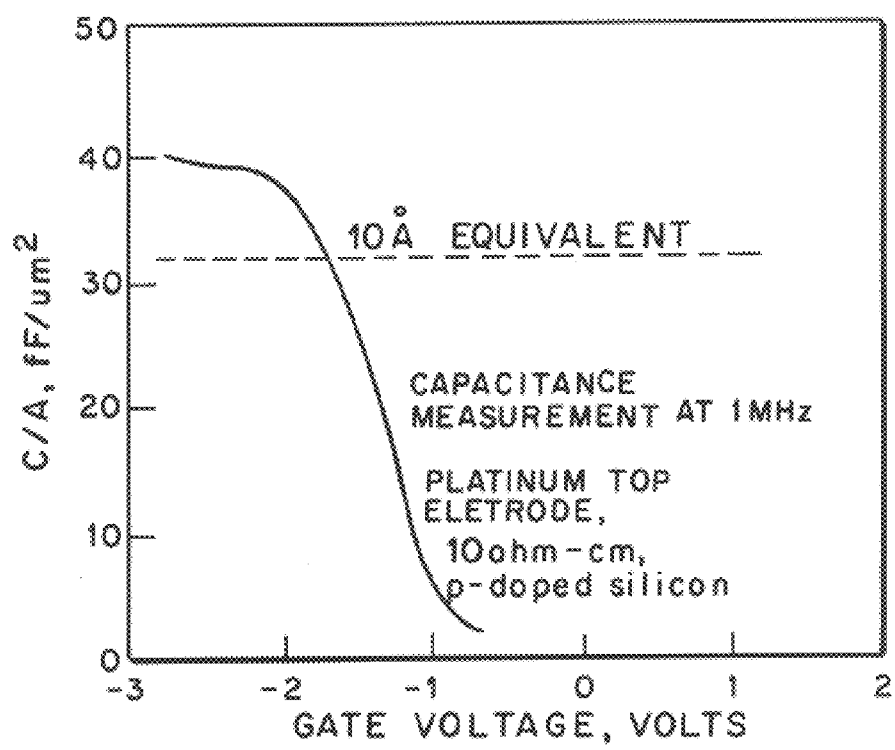
FIG. 6 is a plot of capacitance versus voltage for a $SrTiO_3$ capacitor.

Inasmuch as the perfection of the physical structure of the constructed MOS capacitor couples directly to the electrical structure, we obtain for the constructed capacitor (having the oxide thickness of 150 angstroms) an equivalent oxide thickness of less than 10 angstroms (i.e. about 8.8 angstroms) wherein the equivalent oxide thickness, $t_{eq}$, can be defined for a MOS capacitor as:

$$t_{eq} = \epsilon_0 \frac{\epsilon_{SiO_2}}{(C/A)_{ox}} \quad 1)$$

wherein $\epsilon_{SiO_2}$ and $\epsilon_o$ are the dielectric constants of silica and the permitivity of free space, respectively, and $(C/A)_{ox}$ is the specific capacitance of the MOS capacitor. FIG. 6 shows a plot of our data for specific capacitance against voltage for our constructed capacitor. This capacitor exhibits a C/A value of 40 fF/um$^2$ at negative voltages where the field is across the oxide. The interface trap density, obtained from the frequency dependence of the capacitance data, is sharply peaked at 0.11 ev above the valence band with values that range from $10^{10}$/cm$^2$. An analysis of this data suggests that the interface registry is so perfect that the original silicon surface step interactions can be identified as the interface trap states. The relatively small equivalent oxide thickness for this capacitor is an unparalleled result for MOS capacitors and suggests that crystalline oxides-on-silicon (COS) can potentially replace silica in transistor gate technology.

Accordingly, the aforedescribed embodiment is intended for the purpose of illustration and not as limitation.

What is claimed is:

1. A semiconductor structure including a thin film of crystalline oxide arranged upon a semiconductor-based substrate wherein the crystalline oxide includes unit cells which are capable of exhibiting anisotropic behavior, and wherein the crystalline oxide is arranged in a unit cell arrangement upon the semiconductor-based substrate so that in-plane stain is induced within the unit cells of the crystalline oxide so that a predisposed orientation is thereby imparted to a directional dependent quality of the oxide.

2. The structure as defined in claim 1 wherein the induced in-plane strain influences the geometric shape of the unit cells, and the influence upon the geometric shape of the unit cells imparts a predisposed orientation to the directional-dependent quality of the unit cells.

3. The structure as defined in claim 2 wherein the in-plane strain induced within the unit cells is at least one of a thermal strain, a commensurate strain or a mechanical strain.

4. The structure as defined in claim 1 wherein the in-plane stain induced within the unit cells of the crystalline oxide influences the geometric shape of the unit cells so that the directional-dependent quality of each unit cell of the crystalline oxide is oriented out of the plane of the thin film.

5. The structure as defined in claim 1 wherein the in-plane stain induced within the unit cells of the crystalline oxide influences the geometric shape of the unit cells so that the directional-dependent quality of each unit cell of the crystalline oxide is oriented in the plane of the thin film.

6. The structure as defined in claim 1 in a semiconductor device adapted to be exposed to an externally-applied or an internally-applied field so that the predisposition of the directional-dependent quality of the unit cells of the film beneficially contributes to the operation of the device.

7. The structure as defined in claim 1 wherein the crystalline oxide synergistically couples to the underlying semiconductor-based substrate so that the application of an externally-applied or an internally-applied field to the structure effects the semiconductor characteristics of the substrate.

8. A structure in a semiconductor device including a semiconductor-based substrate and a thin film of crystalline oxide arranged upon a semiconductor-based substrate wherein the crystalline oxide has unit cells which are capable of exhibiting anisotropic behavior and wherein the lattice structures of the unit cells of the crystalline thin film material and the underlying semiconductor-based substrate cooperate to induce an in-plane strain within the unit cells of the crystalline thin film which effects the geometric shape of the unit cells and thereby arranges a directional dependent quality of each unit cell in a predisposed orientation relative to the underlying semiconductor substrate.

9. The structure as defined in claim 8 wherein the in-plane strain induced within the unit cells is at least one of a thermal strain, a commensurate strain or a mechanical strain.

10. The structure as defined in claim 8 wherein the in-plane stain induced within the unit cells of the crystalline oxide influences the geometric shape of the unit cells so that the directional-dependent quality of each unit cell of the crystalline oxide is oriented out of the plane of the thin film or so that the directional-dependent quality of each unit cell of the crystalline oxide is oriented in the plane of the thin film.

11. The structure as defined in claim 8 wherein the semiconductor device within which the structure is used is adapted to be exposed to an externally-applied or an internally-applied field, and the predisposition of the directional-dependent quality of the unit cells of the film beneficially contributes to the operation of the device.

12. The structure as defined in claim 8 wherein the crystalline oxide synergistically couples to the underlying semiconductor-based substrate so that the application of an externally-applied or an internally-applied field to the structure effects the semiconductor characteristics of the substrate.

13. The structure as defined in claim 8 wherein the crystalline oxide is a perovskite, a spinel or an oxide of similarly-related cubic structure which is adapted to exhibit ferroelectric, piezoelectric, pyroelectric, electro-optic, ferromagnetic, antiferromagnetic, magneto-optic or large dielectric properties within the structure.

14. In a semiconductor device for use in a semiconductor application including a substrate of a semiconductor-based material having a surface and a thin film of a crystalline oxide epitaxially overlying the surface of the semiconductor-based substrate, the improvement characterized in that:

the geometry of the unit cells of the crystalline oxide are influenced by the lattice structure of the underlying substrate so that substantially all of the unit cells of the crystalline oxide exhibit a directional-dependent quality which is oriented in the plane of the thin film or so that substantially all of the unit cells of the crystalline oxide exhibit a directional-dependent quality which is oriented out of the plane of the thin film and wherein the crystalline oxide synergistically couples to the underlying semiconductor-based substrate.

15. In a solid state electrical device including a substrate of a semiconductor-based material providing a material surface provided by a face-centered-cubic (fcc) lattice structure and a thin film layup of a crystalline oxide epitaxially overlying the material surface, the improvement characterized in that:

the unit cells of the crystalline oxide are exposed to an in-plane strain induced therein so that the geometry of the unit cells are influenced in a manner which imparts a predisposed orientation to a directional dependent quality of the unit cells.

16. The semiconductor device as defined in claim 15 wherein the device is adapted to be exposed to an externally-applied or an internally-applied field, and the predisposition of the directional-dependent quality of the unit cells of the film beneficially contributes to the operation of the device.

17. The semiconductor device as defined in claim 15 wherein the crystalline oxide is a perovskite, a spinel or an oxide of similarly-related cubic structure which is adapted to exhibit ferroelectric, piezoelectric, pyroelectric, electro-optic, ferromagnetic, antiferromagnetic, magneto-optic or large dielectric properties of the device.

18. The semiconductor device as defined in claim 15 wherein the in-plane strain induced within the unit cells is at least one of a thermal strain, a commensurate strain or a mechanical strain.

19. A device for a semiconductor application wherein the device includes a structure comprising:

a substrate of semiconductor-based material having a surface; and a thin film of crystalline oxide epitaxially overlying the substrate surface wherein the crystalline oxide is capable of exhibiting anisotropic behavior and wherein substantially all of the unit cells of the thin film are exposed to an in-plane strain which influences the geometric shape of the unit cells, and the influence upon the geometric shape of the unit cells imparts a predisposed orientation to the directional-dependent quality of the unit cells, and wherein the oxide film couples to the underlying semiconductor-based material for use of the semiconductor capabilities of the substrate during a semiconductor application.

* * * * *